United States Patent [19]

Deprez

[11] Patent Number: 5,763,149
[45] Date of Patent: Jun. 9, 1998

[54] KIT OF PARTS FOR MAKING AN ALKALINE PROCESSING LIQUID FOR PROCESSING A LITHOGRAPHIC PRINTING PLATE

[75] Inventor: Lode Deprez, Wachtebeke, Belgium

[73] Assignee: AGFA-Gevaert, N.V., Mortsel, Belgium

[21] Appl. No.: 870,416

[22] Filed: Jun. 5, 1997

Related U.S. Application Data

[60] Provisional application No. 60/024,810, Aug. 29, 1996.

[30] Foreign Application Priority Data

Jun. 6, 1996 [EP] European Pat. Off. ............. 96201582

[51] Int. Cl.$^6$ ..................................................... G03C 5/50
[52] U.S. Cl. ..................... 430/466; 430/250; 430/331; 430/465
[58] Field of Search .................................. 430/250, 331, 430/465, 466

[56] References Cited

U.S. PATENT DOCUMENTS

| 5,618,653 | 4/1997 | Vaes et al. | 430/465 |
| 5,622,809 | 4/1997 | Deprez et al. | 430/465 |
| 5,624,784 | 4/1997 | Vaes et al. | 430/465 |

*Primary Examiner*—Hoa Van Le
*Attorney, Agent, or Firm*—Breiner & Breiner

[57] ABSTRACT

The present invention provides a kit of parts for preparing an alkaline processing liquid for use in preparing a lithographic printing plate according to the silver salt diffusion transfer process, and comprising all necessary active compounds for preparing said alkaline processing liquid, said active compounds being comprised in parts physically separated from each other, at least one of said parts comprising an inorganic alkali in solid form, at least one of said parts comprising an alkanolamine as silver halide solvent and at least one of said other parts comprising a hydrophobizing agent and being substantially free from inorganic and/or organic alkali.

9 Claims, No Drawings

… (5,763,149)

KIT OF PARTS FOR MAKING AN ALKALINE PROCESSING LIQUID FOR PROCESSING A LITHOGRAPHIC PRINTING PLATE

This application claims the benefit of U.S. Provisional application Ser. No. 60/024,810 filed Aug. 29, 1996.

FIELD OF THE INVENTION

The present invention relates to a kit of parts for preparing an alkaline processing liquid for use in preparing a lithographic printing plate according to the silver salt diffusion transfer process. The present invention further relates to the use of such kit for preparing an alkaline processing liquid.

BACKGROUND OF THE INVENTION

The principles of the silver complex diffusion transfer reversal process, hereinafter called DTR-process, have been described e.g. in U.S. Pat. No. 2,352,014 and the book "Photographic Silver Halide Diffusion Processes" by Andre Rott and Edith Weyde—The Focal Press—London and New York, (1972).

According to the DTR process, a silver complex salt is image-wise transferred by diffusion from the image-wise exposed silver halide emulsion layer into the image receiving layer, where it is converted to a silver image usually in the presence of physical development nuclei. For this purpose, the image-wise exposed silver halide emulsion layer is developed in the presence of a developing agent and non-developed silver halide is converted by means of a silver halide complexing agent into a soluble silver complex salt while in contact with an image receiving layer.

A DTR-image bearing material can be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2,346,378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

In order to prepare a lithographic printing plate from a monosheet DTR imaging element, the imaging element is developed in an alkaline processing liquid subsequent to an image-wise exposure. Such alkaline processing liquid generally comprises as active compounds, an inorganic alkali, a hydrophobizing agent, an inorganic sulphite and a silver halide solvent. Optionally, the alkaline processing liquid also comprises a developing agent.

Due to the alkaline nature of the liquid, the shipping of such alkaline processing liquids is subject to several regulations. Moreover, during storage and transportation the liquid may deteriorate to some extent so that the liquid generally has a limited tenability. Furthermore, a substantial waste of packaging, generally in plastic form, is generated thereby presenting an ecological disadvantage and causing inconvenience for customers using substantial volumes.

Accordingly, the need exists for bringing the alkaline liquid in a more concentrated and convenient form. In the past, proposals have been made to freeze-dry or spray-dry the alkaline liquid so that it can be shipped in a solid form and dissolved in e.g. water when needed. However, such procedure has the disadvantage of being expensive and moreover the lithographic printing plates that are obtained using an alkaline processing liquid prepared by dissolving the solid have a bad performance particularly in terms of ink acceptance and printing endurance.

EP-A-95200694 discloses a kit of parts for preparing an alkaline processing liquid for use in preparing a lithographic printing plate according to the silver salt diffusion transfer process, and comprising all necessary active compounds for preparing said alkaline processing liquid, said active compounds being comprised in parts physically separated from each other, at least one of said parts comprising an inorganic alkali in solid form and at least one of said other parts comprising a hydrophobizing agent and being substantially free from inorganic alkali. Said kit of parts present a solution to the aforementioned problems but when stored for some time said kit of parts if comprising an alkanolamine is not stable. This is proven by the fact that when using said kit of parts after standing for some time for making an alkaline processing liquid and using this alkaline processing liquid in preparing a lithographic printing plate according to the silver salt diffusion transfer the so obtained lithographic printing plate had a bad ink acceptance.

SUMMARY OF THE INVENTION

Accordingly it is an object of the present invention to provide a solution to the aforementioned problems.

Further objects of the present invention will become clear from the description hereinafter.

According to the present invention there is provided a kit of parts for preparing an alkaline processing liquid for use in preparing a lithographic printing plate according to the silver salt diffusion transfer process, and comprising all necessary active compounds for preparing said alkaline processing liquid, said active compounds being comprised in parts physically separated from each other, at least one of said parts comprising an inorganic alkali in solid form, at least one of said parts comprising an alkanolamine as silver halide solvent and at least one other of said parts comprising a hydrophobizing agent and being substantially free from inorganic and/or organic alkali.

According to the present invention there is further provided a use of the above identified kit of parts for preparing an alkaline processing liquid to be used for preparing a lithographic printing plate according to the silver salt diffusion transfer process.

DETAILED DESCRIPTION OF THE INVENTION

In accordance with the present invention it has been found that an alkaline processing liquid prepared from a kit of parts as set out above, does not have a detrimental effect on the performance of a lithographic printing plate obtained therewith according to the silver salt diffusion transfer process, even when said kit of parts has been stored for some time at elevated temperature. Further, according to a highly preferred embodiment of the present invention all parts of the kit are substantially free of water or only contain a minimum of water so that a highly concentrated form of the alkaline processing liquid may be obtained and thus reducing the amount of packaging needed.

To achieve the benefits of the present invention it is essential that inorganic and organic alkali is separated from other parts of the kit that comprise the hydrophobizing agent. Apart from this requirement, the hydrophobizing agent may be present in one or more parts of the kit that comprise other active compounds of the alkaline processing liquid.

Further, upon preparing of the alkaline processing liquid from a kit of parts in accordance with the present invention it is highly recommended that at least part and preferably all of the solid inorganic alkali first be dissolved in water and that subsequent thereto the part or parts comprising the hydrophobizing agent and the part or parts comprising alkanolamine be added thereto. Such way of preparing will assure the best performances of printing plates obtained with such alkaline processing liquid.

In accordance with the present invention, the alkaline processing liquid preferably includes at least an inorganic alkali, an alkanolamine as silver halide solvent, a hydrophobizing agent and an inorganic sulphite such as e.g. potassium sulphite, sodium sulphite or ammonium sulphite as active compounds.

As inorganic alkali that may be used in connection with the present invention there are sodium hydroxide, potassium hydroxide, magnesium oxide, carbonates such as e.g. calcium carbonate etc.. In addition to such inorganic alkali it may be convenient to include (organic alkali such as e.g. alkanol amines that may function not only to provide alkalinity but also as silver halide solvents.

The hydrophobizing agents used in connection with the present invention are compounds that are capable of reacting with silver or silver ions and that are hydrophobic i.e. insoluble in water or only slightly soluble in water. Generally these compounds comprise a heterocyclic nucleus substituted by a mercapto group or thiolate group and one or more hydrophobic substituents e.g. an alkyl comprising at least 4 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

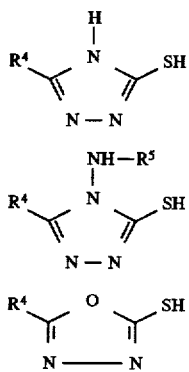

wherein $R^5$ represents hydrogen or an acyl group. $R^4$ represents alkyl, aryl or aralkyl. Most preferably used compounds are compounds according to one of the above formulas wherein $R^4$ represents an alkyl comprising 4 to 16 C-atoms.

Alkanolamines that are suitable for use as silver halide solvent in accordance with the present invention may be of the tertiary, secondary or primary type. Examples of alkanolamines that may be used in connection with the present invention correspond to the following formula:

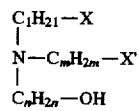

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

The alkanolamine compounds are preferably used in combination with an meso-ionic compound such as e.g. a triazolium thiolate or tetrazolium thiolate. Highly preferred meso-ionic compounds correspond to the following formula:

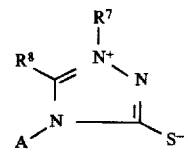

wherein $R^7$ and $R^8$ each independently represents an unsubstituted or substituted alkyl group, alkenyl group, cycloalkyl group, aralkyl group, aryl group or heterocyclic group, A represents an unsubstituted or substituted alkyl group, alkenyl group, cycloalkyl group, aralkyl group, aryl group, heterocyclic group or $-NR^9R^{10}$ and $R^9$ and $R^{10}$ each independently represents hydrogen, an alkyl group or aryl group and wherein $R^7$ and $R^8$ or $R^8$ and A or $R^9$ and $R^{10}$ can combine with each other to form a 5- or 6-membered ring.

Further silver halide solvents that may be used in connection with the present invention are e.g. thioethers as disclosed in e.g. U.S. Pat. No. 5,200,294, 2-mercaptobenzoic acid, cyclic imides and oxazolidones.

The alkaline processing liquid may further include other active compounds such as developing agents, calcium sequestering agents and development accelerators. Developing agents suitable for use in connection with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone.

According to a particularly preferred embodiment in connection with the present invention, the kit of parts consists of only three parts holding all active compounds necessary for preparing the alkaline processing liquids. A first part will comprise the inorganic alkali in solid form optionally in combination with other active compounds other than the hydrophobizing agent and the alkanolamine e.g. sulphite. The hydrophobizing agent will be, in accordance with this invention, comprised in the second part of the kit. Such second part may also comprise other active compounds except for solid inorganic alkali and/or organic amine, and part of which active compounds can also be present in the first part. The alkanolamine will be, in accordance with this invention, comprised in the third part of the kit. Such third part may also comprise other active compounds, and part of which active compounds can also be present in the first or second part.

It is of course possible to combine the inorganic alkali with the alkanolamine and optionally other active compounds other than the hydrophobizing compound in one kit but this is less convenient.

In connection with the present invention, the kit of parts may also comprise more than three parts, e.g. four or five parts, and wherein the hydrophobizing agent or alkanolamine or solid inorganic alkali may be present in more than one part as long as the hydrophobizing agent remains effectively separated from the alkanolamine and/or the inorganic alkali. Further, in such an embodiment involving more than three parts, a particular active compound, e.g. a meso-ionic compound, may be present in several or all parts of the kit.

The solid form of the inorganic alkali in connection with the present invention may take any form but is preferably a powdered form, pellet or tablet. A particular interesting solid form is a layered tablet wherein the different constituents of the tablet are present in different layers. For example, a tablet of a sulphite and an inorganic alkali such as sodium hydroxide may be formed wherein the inner part of the tablet comprises most or all of the sulphite and wherein the outer part comprises most or all of the inorganic alkali.

The part or parts of the kit comprising the hydrophobizing agent may be in solid form or liquid form. When such part is provided in solid form, it is preferably a powdered form which is mixed with a powdered form of another active component of the alkaline processing solution such as e.g. a meso-ionic compound or a sulphite.

In another preferred embodiment the part or parts of the kit comprising the hydrophobizing agent in solid form is obtained by using a powdered form on which the hydrophobizing agent has been sprayed from an alcoholic solution such that the hydrophobizing agent is present at the surface of the powder particles. Suitable powder particles for this purpose may be formed from another active compound of the alkaline processing liquid such as e.g. a meso-ionic compound or a sulphite. Spraying of the powdered particles is conveniently achieved by air-whirling the powdered particles during spraying.

According to a particular embodiment of the present invention, the alcoholic solution used for spraying the hydrophobizing agent may further comprise a polyol such as e.g. glycerin or a poly alkyleneoxide such as e.g. ethylene glycol or propylene glycol. As a further alternative, the hydrophobizing agent may be dissolved in such a polyol or poly alkyleneoxide and sprayed on the powder particles without the use of a further alcohol.

As an alternative a part of the kit comprising the hydrophobizing agent may be provided in a liquid form. Such liquid form may be obtained with the aid of water and a surfactant or with the aid of a mixture of water and a lower alcohol. Alternatively, the liquid form can be obtained by using a polyol such as glycerin into which the hydrophobizing agent may be dissolved.

The part of the kit comprising alkanolamine is usually in a liquid form. Said part of kit can be prepared by only mixing active components of the alkaline processing liquid but preferably a small amount of water, more preferably between 5 and 10% by weight of the alkanolamine is added for an easier mixing. Alternatively, said part of kit comprising alkanolamine can be in a solid form when the alkanolamine is added in the form of a solid hydrogensulphite/alkanolamine complex or a solid sulphurdioxide/alkanolamine complex Further parts of the kit in accordance with the present invention may be either in solid form or liquid form.

The alkaline processing liquid prepared from a kit of parts in accordance with the present invention is suitable for preparing a lithographic printing plate from an imaging element according to the silver salt diffusion transfer process. Such imaging element preferably comprises on a support a silver halide emulsion layer and a physical development nuclei layer provided in that order. Optionally, a base layer or anti-halation layer can be provided between the support and the silver halide emulsion layer.

According to a typical method for preparing a printing plate, an imaging element as described above is image-wise exposed, e.g. by camera or laser, and is subsequently developed using an alkaline processing liquid. Preferably, the alkaline development is followed by a stabilisation using a stabilising liquid that generally reduces the pH at the surface of the printing plate. Such method is disclosed in e.g. U.S. Pat. No. 5,200,294.

According to an alternative method, a printing plate may be obtained using an imaging element comprising on an aluminium support in the order given a layer comprising physical development nuclei and a silver halide emulsion layer. After image-wise exposure such imaging element is developed using an alkaline processing liquid and is subsequently washed to remove the silver halide emulsion layer and other optional layers so as to expose a silver image formed in the layer comprising the physical development nuclei. Such method is disclosed in e.g. EP-A 410500.

The invention will now be illustrated by the following examples without however the intention to limit the invention thereto. All parts given are by weight unless otherwise specified.

EXAMPLE 1

Preparation of the Silver Halide Emulsion Coating Solution

A silver chlorobromide emulsion composed of 98.2 mole % of chloride and 1.8 mole % of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized.

A base layer coating solution was prepared having the following composition:

| gelatin | 5.5% |
| carbon black | 0.76% |
| silica particles (5 μm) | 1.6% |

Preparation of the Imaging Element

The emulsion coating solution and base layer coating solution were simultaneously coated by means of the cascade coating technique to a polyethylene terephthalate support provided with a pack of two backing layers such that the base layer coating was coated directly to the side of the support opposite to the side comprising said backing layers. The emulsion layer was coated such that the silver halide coverage expressed as $AgNO_3$ was 1.5 g/m$^2$ and the gelatin content was 1.5 g/m$^2$. The emulsion layer further contained 0.15 g/m$^2$ of 1-phenyl-4-methyl-3-pyrazolidone and 0.25 g/m$^2$ of hydroquinone. The base layer was coated such that the amount of gelatin in the coated layer was 3 g/m$^2$.

The thus obtained element was dried and subjected to a temperature of 40° C. for 5 days and then the emulsion layer was overcoated with a layer comprising PdS as physical development nuclei, hydroquinone at 0.4 g/m² and formaldehyde at 100 mg/m². An alkaline processing liquid having the following composition was prepared:

| | |
|---|---|
| sodium hydroxide (g) | 32.5 |
| sodium sulphite anh. (g) | 35 |
| compound A (see below) (g) | 0.8 |
| 2-mercapto-5-n.heptyl-oxa-3,4-diazole (mg) | 350 |
| EDTA sodium salt (g) | 1 |
| amino-ethyl-amino-ethanol (ml) | 45 |
| methylhydroquinone (g) | 2 |
| water to make | 1 liter |

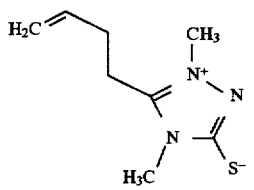

compound A

The above alkaline processing liquid was prepared using various kits of parts as follows:

(1) A kit of parts was used consisting of the following parts:
 (a) a mixture of sodium hydroxide, 2-mercapto-5-n.heptyl-oxa-3,4-diazole (the hydrophobizing agent), sodium sulphite and EDTA, all in powdered form;
 (b) 0.8 g of compound A and 2 g of methylhydroquinone dissolved in 45 ml of amino-ethyl-amino-ethanol and 3 ml of water.

(2) A kit of parts was used consisting of the following parts:
 (a) a mixture of sodium hydroxide, sodium sulphite and EDTA, all in powdered form;
 (b) 0.8 g of compound A, 2 g of methylhydroquinone and 350 mg of 2-mercapto-5-n.heptyl-oxa-3,4-diazole (the hydrophobizing agent), dissolved in 45 ml of amino-ethyl-amino-ethanol and 3 ml of water.

(3) A kit of parts was used consisting of the following parts:
 (a) a mixture of sodium hydroxide, sodium sulphite and EDTA;
 (b) 0.8 g of compound A and 2 g of methylhydroquinone dissolved in 45 ml of amino-ethyl-amino-ethanol and 3 ml of water;
 (c) 350 mg of 2-mercapto-5-n.heptyl-oxa-3,4-diazole (the hydrophobizing agent).

The alkaline processing liquids were all prepared by first mixing part (a) into water and subsequent thereto part (b) and in the case being then part (c).

To prepare printing plates from the above described imaging elements, the imaging elements were image-wise exposed (camera exposure) and then developed using one of the alkaline processing liquids obtained from the 3 kits of parts disclosed above, said kits being used for preparing an alkaline processing liquid immediately after being prepared (fresh) and after having been stored for 14 days at 60° C. (aged). Subsequent to this development, the plates were guided through a neutralising liquid having the following composition:

| | |
|---|---|
| citric acid | 10 g |
| sodium citrate | 35 g |

-continued

| | |
|---|---|
| cysteine | 1 g |
| sodium sulphite anh. | 5 g |
| phenol | 50 mg |
| water to make | 1 l |

The obtained printing plates were then used to print on a printing press using a commonly employed ink and an aqueous dampening liquid containing colloidal silica. The ink acceptance expressed as the number of copies that has to be made before the printing areas will print without white spots for each of the printing plates was evaluated. The results are given in table 1.

TABLE 1

| | Fresh | Aged |
|---|---|---|
| Kit 1 | >100 | — |
| Kit 2 | 15 | >100 |
| Kit 3 | 15 | 15 |

It was found that the alkaline processing liquid prepared from even a fresh kit number 1 (comparative kit) yielded printing plates that had a poor ink acceptance whereas the ink acceptance when using the alkaline processing liquid from fresh kits 2 and 3 was good. However the alkaline processing liquid prepared from an aged kit number 2 (comparative kit) yielded printing plates that had a poor ink acceptance whereas the ink acceptance when using the alkaline processing liquid from an aged kit 3 (kit according to the invention) remained good.

EXAMPLE 2

Printing plates were prepared similar to the procedure of example 1 but with the exception that in the alkaline processing liquid 2-mercapto-5-n.heptyl-oxa-3,4-diazole was replaced by 3-mercapto-4-amino-5-n.heptyl-1,2,4-triazole as hydrophobizing agent.

The above alkaline processing liquid was prepared using various kits of parts as follows:

(1) A kit of parts was used consisting of the following parts:
 (a) a mixture of sodium hydroxide, 3-mercapto-4-amino-5-n.heptyl-1,2,4-triazole (the hydrophobizing agent), sodium sulphite and EDTA, all in powdered form;
 (b) 0.8 g of compound A and 2 g of methylhydroquinone dissolved in 45 ml of amino-ethyl-amino-ethanol and 3 ml of water.

(2) A kit of parts was used consisting of the following parts.:
 (a) a mixture of sodium hydroxide, sodium sulphite and EDTA, all in powdered form;
 (b) 0.8 g of compound A, 2 g of methylhydroquinone and 350 mg of 3-mercapto-4-amino-5-n.heptyl-1,2,4-triazole (the hydrophobizing agent), dissolved in 45 ml of amino-ethyl-amino-ethanol and 3 ml of water.

(3) A kit of parts was used consisting of the following parts:
 (a) sodium hydroxide;
 (b) 0.8 g of compound A and 2 g of methylhydroquinone dissolved in 45 ml of amino-ethyl-amino-ethanol and 3 ml of water;
 (c) 350 mg of 2-mercapto-5-n.heptyl-oxa-3,4-diazole (the hydrophobizing agent), 35 g of sodium sulphite and 1 g of EDTA, all in powdered form.

The alkaline processing liquids were all prepared by first mixing part (a) into water and subsequent thereto part (b) and in the case being then part (c).

To prepare printing plates from the above described imaging elements, the imaging elements were image-wise exposed (camera exposure) and then developed using one of the alkaline processing liquids obtained from the 3 kits of parts disclosed above, said kits being used for preparing an alkaline processing liquid immediately after being prepared (fresh) and after having been stored for 14 days at 60° C. (aged). Subsequent to this development, the plates were guided through a neutralising liquid as described in example 1.

The obtained printing plates were then used to print on a printing press using a commonly employed ink and an aqueous dampening liquid containing colloidal silica. The ink acceptance expressed as the number of copies that has to be made before the printing areas will print without white spots for each of the printing plates was evaluated. The results are given in table 2.

TABLE 2

|  | Fresh | Aged |
|---|---|---|
| Kit 1 | >50 | — |
| Kit 2 | 20 | >50 |
| Kit 3 | 20 | 20 |

It was found that the alkaline processing liquid prepared from even a fresh kit number 1 (comparative kit) yielded printing plates that had a poor ink acceptance whereas the ink acceptance when using the alkaline processing liquid from fresh kits 2 and 3 was good. However the alkaline processing liquid prepared from an aged kit number 2 (comparative kit) yielded printing plates that had a poor ink acceptance whereas the ink acceptance when using the alkaline processing liquid from an aged kit 3 (kit according to the invention) remained good.

I claim:

1. A kit of parts for preparing an alkaline processing liquid for use in preparing a lithographic printing plate according to the silver salt diffusion transfer process, and comprising all necessary active compounds for preparing said alkaline processing liquid, said active compounds being comprised in parts physically separated from each other, at least one of said parts comprising an inorganic alkali in solid form, at least one of said parts comprising an alkanolamine as silver halide solvent and at least one other of said parts comprising a hydrophobizing agent and being substantially free from inorganic and/or organic alkali.

2. A kit according to claim 1 wherein said active compounds include a meso-ionic compound and an inorganic sulphite.

3. A kit according to claim 2 wherein said active compounds further include a developing agent.

4. A kit according to claim 1 wherein said part comprising said hydrophobizing agent is present in solid form.

5. A kit according to claim 4 wherein said part comprising said hydrophobizing agent comprises an inorganic sulphite.

6. A kit according to claim 1 wherein said kit consists of three parts being physically separated, a first part comprising said inorganic alkali in solid form, a second part comprising said hydrophobizing agent and an inorganic sulphite and a third part comprising an alkanolamine .

7. A kit according to claim 6 wherein said second part further comprises ethylene diamine tetraacetic acid and said third part further comprises a meso-ionic compound and a developing agent.

8. A method of using of a kit of parts as defined in claim 1 for preparing an alkaline processing liquid for making a printing plate according to the silver salt diffusion transfer process.

9. The method of using of a kit of parts according to claim 8 wherein said part(s) comprising said inorganic alkali is (are) dissolved in water and subsequently said other part(s) is (are) dissolved in a thus obtained alkaline solution.

* * * * *